United States Patent [19]
Brehmer

[11] Patent Number: 5,668,486
[45] Date of Patent: Sep. 16, 1997

[54] STROBED COMPARATOR FOR A LARGE COMMON MODE RANGE

[76] Inventor: Geoffrey E. Brehmer, Rte. 1, Box 30BB, Lexington, Tex. 78947

[21] Appl. No.: 668,414

[22] Filed: Jun. 21, 1996

[51] Int. Cl.$^6$ ............................................. H03K 5/22
[52] U.S. Cl. ........................... 327/66; 327/65; 330/311
[58] Field of Search ............................. 327/63, 65, 66, 327/67, 77, 560–563; 330/311, 253

[56] References Cited

U.S. PATENT DOCUMENTS

| | | | |
|---|---|---|---|
| 4,965,468 | 10/1990 | Nicollini et al. | 330/253 |
| 5,015,966 | 5/1991 | McIntyre | 330/311 |
| 5,323,121 | 6/1994 | Butler | 330/311 |
| 5,457,426 | 10/1995 | Brehmer | 330/253 |
| 5,497,122 | 3/1996 | Somayajula | 330/311 |
| 5,528,185 | 6/1996 | Lewicki et al. | 327/203 |

FOREIGN PATENT DOCUMENTS 2 251 745  7/1992  United Kingdom ............. H03F 3/30

OTHER PUBLICATIONS

R.K. Hester, et al., "Fully Differential ADC with Rail-to-Rail Common-Mode Range and Nonlinear Capacitor Compensation," *IEEE Journal of Solid–State Circuits*, vol. 25, No. 1, pp. 173–182 (Feb. 1990).

M. Milkovic, "Current Gain High–Frequency CMOS Operational Amplifiers," *IEEE Journal of Solid–State Circuits*, vol. SC–20, No. 4, pp. 845–851 (Aug. 1985).

*Primary Examiner*—Toan Tran
*Attorney, Agent, or Firm*—Joseph W. King, Jr.

[57] ABSTRACT

A strobed comparator for a large common mode range is described, which includes a mixture of natural and enhancement transistors, and a high-swing folded-cascode architecture, to achieve an improved dynamic range suitable for audio applications.

6 Claims, 3 Drawing Sheets

PREFERRED EMBODIMENT

STROBED COMPARATOR FOR A LARGE COMMON MODE RANGE

SPECIFICATION

BACKGROUND OF THE INVENTION

1. Field of the Invention

This invention relates to a strobed comparator for a large common mode range.

2. Brief Description of the Related Technology

The current trend for mixed analog and digital integrated circuits is to integrate an increasing amount of functions into a single piece of silicon, and to reduce the overall system power dissipation by continually reducing the power supply voltage to the chip. These trends reduce the overall cost of the system, but increase the die area, power consumption, and noise floor for the silicon which increases hinder high performance analog circuits, hence creating a need for analog circuits that have improved signal to noise performance and able to operate at increasingly lower power supply voltage levels.

Decoupling the digital ground and power supply from the analog ground and power supply is necessary, but may not yield adequate dynamic range for high performance analog applications, such as CD audio products. The current trend for such products is to use over-sampled analog-to-digital and digital-to-analog converters, which convert analog signals to digital signals, and vice versa. Also, the strobed comparator is a necessary part of these architectures. It provides the quantizing of the analog signal. Therefore, a real need exists for a comparator that has increased common mode range and increased dynamic range performance. Such a comparator will allow the entire analog circuitry to operate with increased signal swings, thus, increasing the overall dynamic range of the system.

SUMMARY OF THE INVENTION

The comparator of the present invention implements a strobed comparator architecture having a mixture of enhancement transistors, natural transistors, and a high-swing folded cascode circuit architecture. The enhancement transistor has higher doping concentrations under the gate, thus, increasing its threshold voltage. The natural transistor has a lower doping concentration under its gate, thus, creating a much lower threshold voltage. A consequence of the lower doping concentration within the natural transistor is that it can become very leaky with a Vgs=O. Therefore, the placement of such device in the circuit architecture is very critical. To reduce power consumption, it is important to ensure that the leaky characteristics of the natural device will not create unwanted current paths or otherwise hinder the operation of the circuit.

The present invention utilizes these natural transistors in such a way that they will never be turned off, or they will be implemented in series with enhancement transistors that can be completely turned off. An example of this arrangement is an input differential amplifier pair. These devices, along with the high-swing folded cascode structure, increase the common mode input range to be nearly rail to rail. Prior art differential pair circuits, found in FIG. 1, typically use single N-channel or P-channel devices, or they must implement a mixture of N-channel and P-channel cross coupled enhancement devices, as in FIG. 2, to achieve a rail to rail common mode input range. The single N-channel or P-channel input pair architecture has a reduced common mode voltage range because of the large Vt, or threshold voltage, of the input device. The cross-coupled N-channel and P-channel structure improves the common mode range, but it is quite complex and has gain and switching limitations that can reduce the performance of the overall comparator. These gain and switching limitations are caused by the mismatch in device performance between the N-channel and P-channel transistor pairs. As the common mode range traverses from VSS to VCC, the P-channel pair changes from a completely turned on state to being completely turned off, and likewise, the N-channel transistor pair changes from being completely turned off to being completely turned on.

By using a mixture of natural and enhancement transistors and a high-swings folded cascode architecture, the overall comparator architecture of the present invention is able to achieve a common mode voltage range similar to that of a cross-coupled architecture, while having the simplicity and constant gain of the single enhancement transistor architecture.

DETAILED DESCRIPTION OF THE PREFERRED EMBODIMENT

Figure 1:
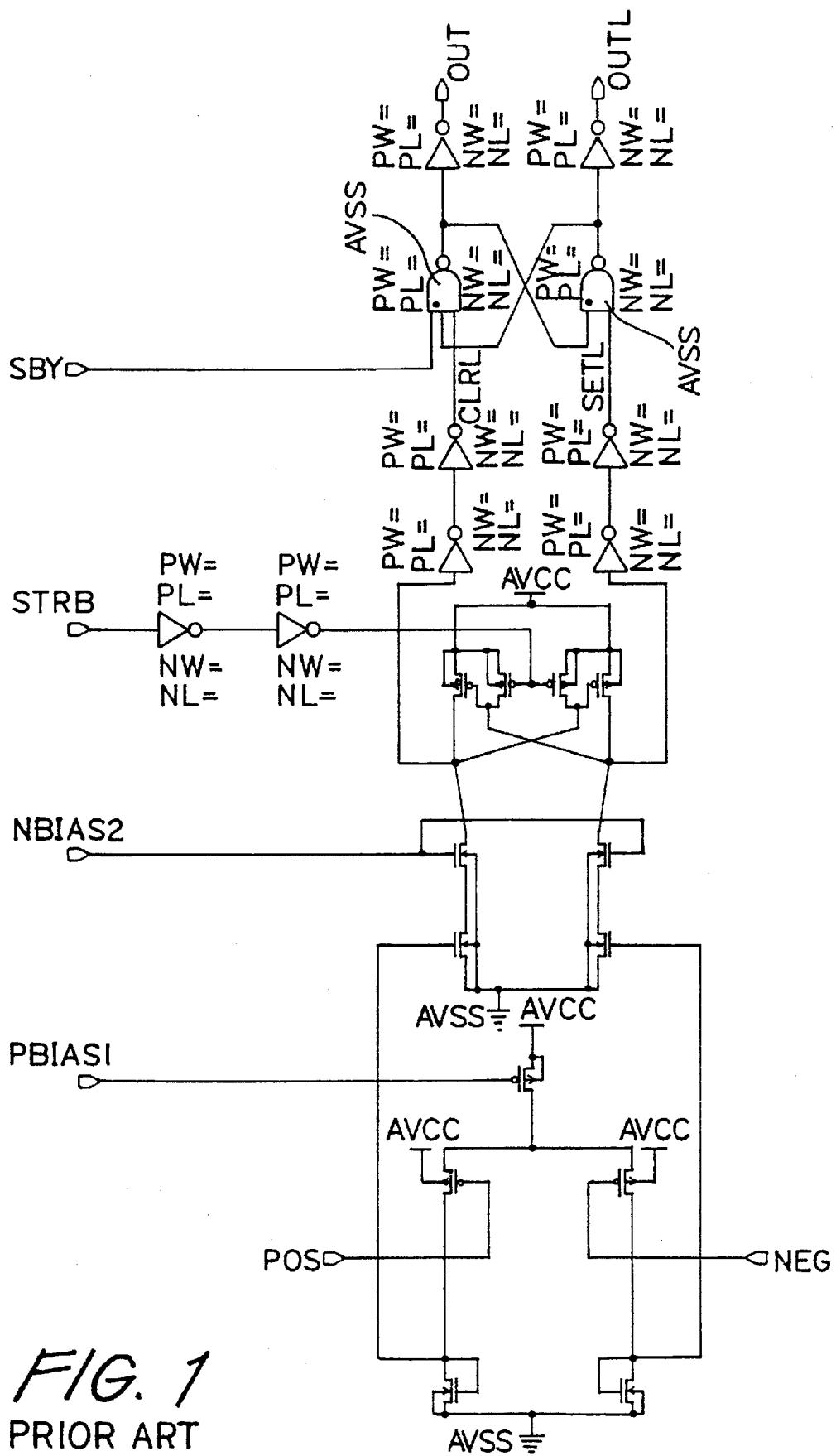
FIG. 1 schematically illustrates a strobed comparator design having a single P-channel input differential pair, of the prior art.
Figure 2:
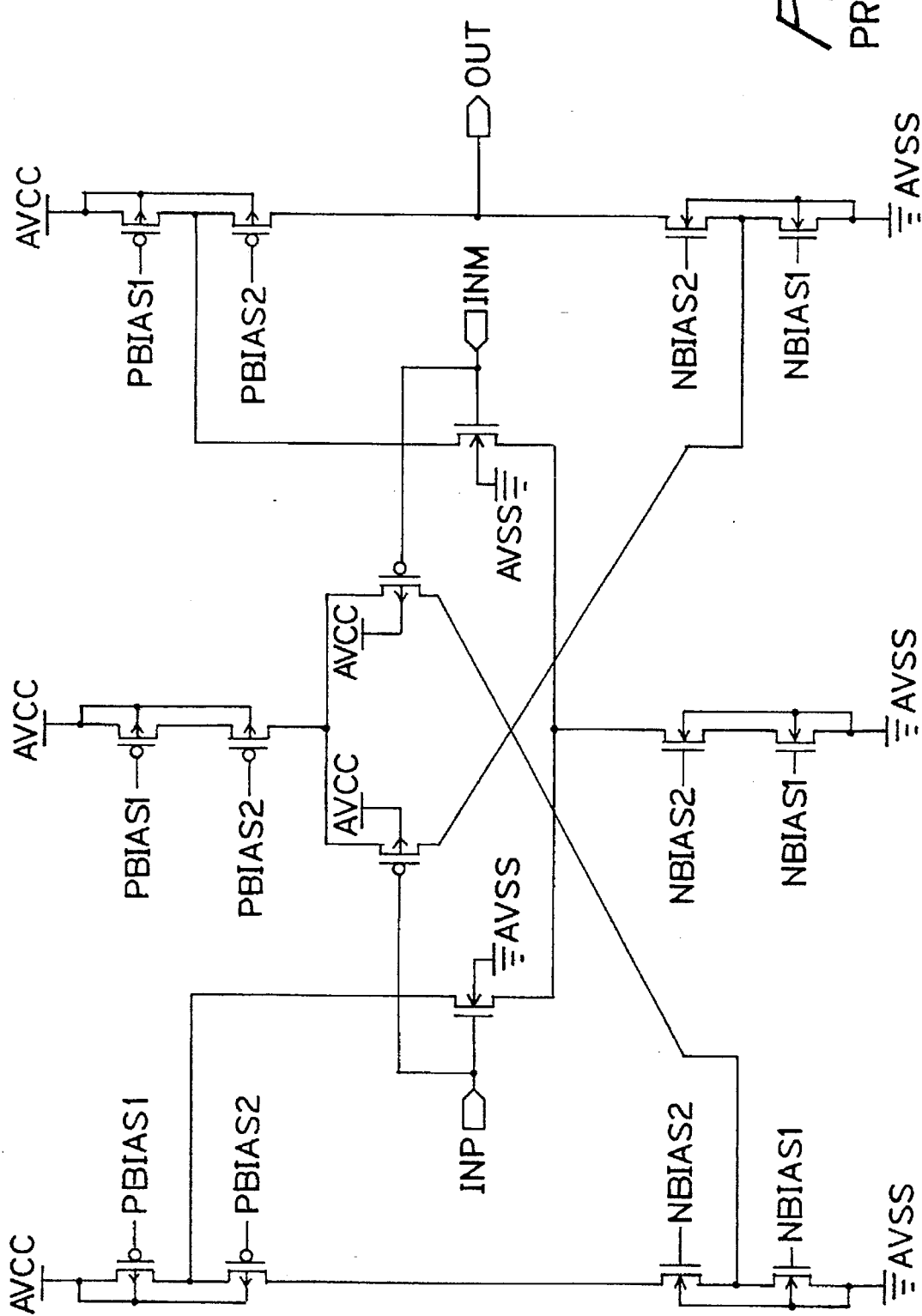
FIG. 2 schematically illustrates a cross coupled P-channel and N-channel input differential pair having high-swing folded cascode loads.
Figure 3:
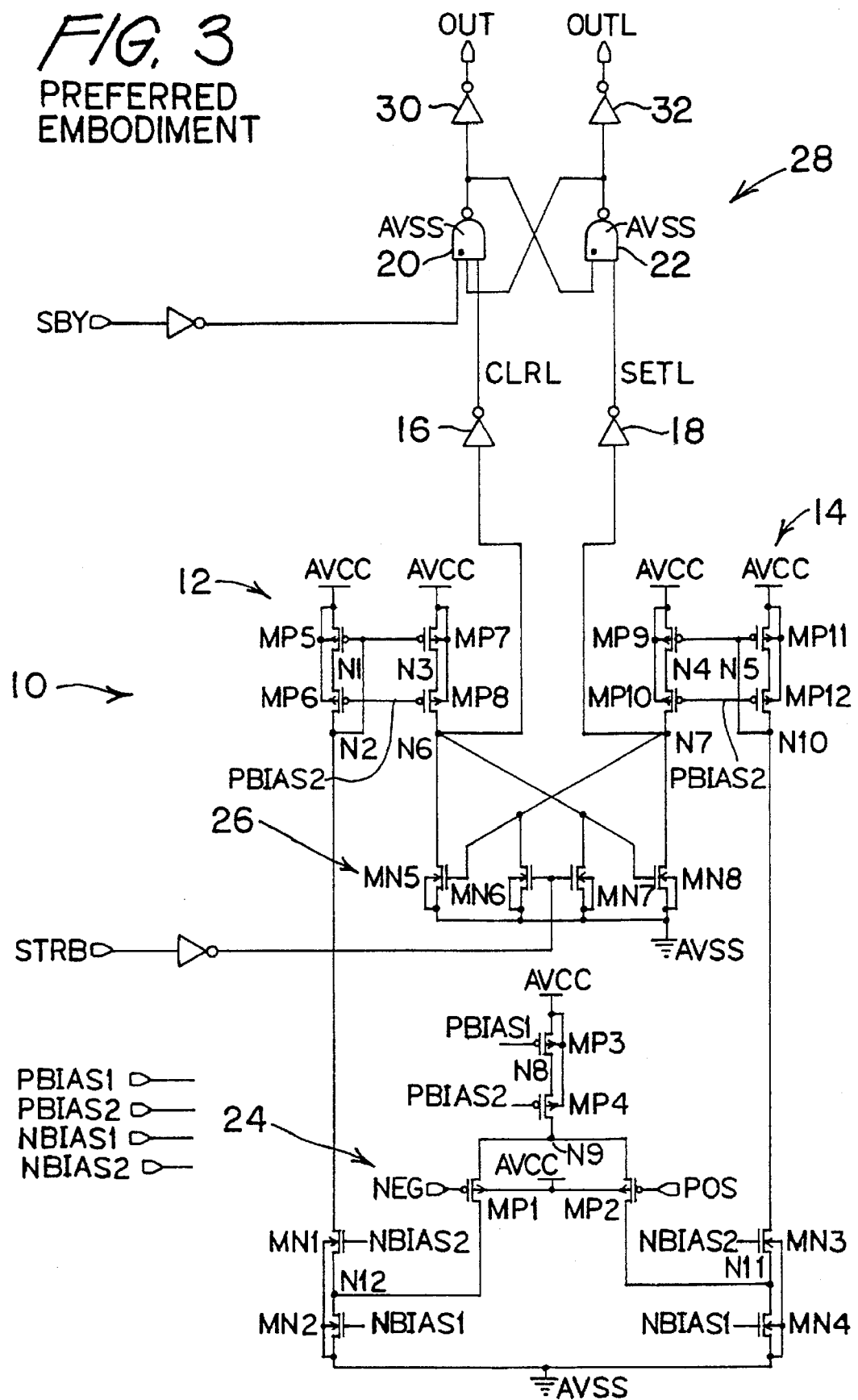
FIG. 3 schematically illustrates the strobed comparator architecture of the present invention.

Referring to FIG. 3, the basic operation of the architecture of the folded-cascode input stage 24 of comparator 10 is as follows: P-channel enhancement transistor MP3 and MP4 set up the bias current for the natural P-channel differential pair, transistors MP1 and MP2. N-channel enhancement transistors MN1, MN2, MN3 and MN4 establish the folded cascode loads for the differential pair. A difference in the input voltage between inputs POS and NEG establishes a current difference within MP1 and MP2 of FIG. 3. This current difference is transferred to the high-swing cascode current mirror circuits 12 and 14, which include transistors MP5, MP6, MP7, MP8, MP9, MP10, MP11, and MP12.

The strobed control stage circuit 26 of comparator 10 is implemented using N-channel enhancement transistors MN5, MN6, MN7, and MN8. During the un-strobed time, i.e. when input strobe signal STRB is low, transistors MN6 and MN7 are turned on, which pull nodes N6 and N7 to AVSS, or ground potential. This operation does not change the logical state of outputs OUT or OUTL because the clear and set function of latch 28 is determined with a logical low value. Also, during this un-strobed time, the voltage difference on inputs POS and NEG of comparator 10 establishes a current difference in the P-channel cascode current mirroring circuits 12 and 14, described above, which prepares comparator 10 for the next comparison to take place.

During strobed time, when a comparison from comparator 10 is required, input strobe signal STRB is a logical high, which turns off transistors MN6 and MN7, thereby allowing the P-channel cascode current mirror circuits 12 and 14 to begin pulling nodes N6 and N7 toward the level of supply voltage AVCC. The cascode current mirror circuits 12 and 14, having a higher sourcing current established from the voltage difference in differential pair transistors MP1 and MP2, begin pulling high their respective node, N6 or N7, more quickly. As this respective node, N6 or N7, begins to pull high, it creates positive feedback on the gate of transistor MN8 or MN5, thereby pulling the other respective node, N6 or N7, to the level of AVSS, or ground potential, which allows the other respective node, N6 or N7, to pull to AVCC more easily.

This pull up or pull down function is accomplished by the cross coupled nature of the gate of transistor MN8 with node N6 and the gate of MN5 with node N7. The resulting function reinforces the logical differences between N6 and N7 during the strobed time.

The logical states of nodes N6 and N7 are preferably buffered through inverters 16 and 18 on the input of latch 28. Latch 28 is formed with NAND gates 20 and 22, but may be configured with other logic gates to create a latch. The logical states of N6 and N7 are then buffered again using inverters 30 and 32, on latch 28 output, and are driven as the differential outputs OUT and OUTL.

The function of input signal standby, or SBY, of latch 28 is to set the outputs of comparator 10 to a known logical state and prevent them from toggling while comparator 10 is non-operational, or powered down. This is accomplished by clearing and holding latch 28 into a known logical state, which establishes known states on output nodes OUT and OUTL.

Bias signals PBIAS1, PBIAS2, NBIAS1, and NBIAS2 provide appropriate bias to the respective transistors, as shown in FIG. 3.

The present invention, therefore, is well adapted to carry out the objects and attain the ends and advantages mentioned herein as well as other ends and advantages made apparent from the disclosure. While preferred embodiments of the invention have been described from the purpose of disclosure, numerous changes and modifications of those embodiments described herein will be readily apparent to those skilled in the art and are encompassed within the spirit of the invention and the scope of the following claims.

What is claimed is:

1. A comparator circuit, comprising:
   (a) a folded-cascode input stage circuit having differential outputs and differential inputs;
   (b) strobed control stage circuit having an input and differential outputs;
   (c) a first current mirror circuit, having an input connected to a differential output of said folded-cascode input stage circuit and an output connected to a differential output of said strobed control stage circuit;
   (d) a second current mirror circuit, having an input connected to another differential output of said folded-cascode input stage circuit and an output connected to another differential output of said strobed control stage circuit; and
   (e) an input strobe signal connected to said strobed control stage circuit input; wherein when said input strobe signal is at a first logic level said output of said first current mirror circuit and said output of said second current mirror circuit are pulled to ground potential, wherein said first and said second current mirror circuits provide an output for said comparator circuit.

2. The comparator circuit of claim 1, wherein when said input strobe signal is at a second logic level said output of said first current mirror circuit and said output of said second current mirror circuit pull to the corresponding logical states of said inputs of said first and second current mirror circuits.

3. The comparator circuit of claim 1, wherein said comparator circuit output is a latched output.

4. The comparator circuit of claim 1, wherein said differential inputs of said folded-cascode input stage include natural transistor devices.

5. A method of controlling the logical output of a comparator circuit, comprising the steps of:
   (a) providing a comparator circuit, comprising a folded-cascode input stage circuit having differential outputs and inputs; a strobed control stage circuit having an input and differential outputs; a first and a second current mirror circuit, each said current mirror circuit having an input connected to a differential output of said folded-cascode input stage circuit, and an output connected to a differential output of said strobed control stage circuit;
   (b) providing an input strobe signal to said input of said strobed control stage circuit; and
   (c) pulling said output of said first and said output of said second current mirror circuit to ground potential when said input strobe signal is at a first logic level.

6. The method of claim 5, further comprising the step of pulling said output of said first current mirror circuit and said output of said second current mirror circuit to the corresponding logical states of said inputs of said first and second current mirror circuits when said input strobe signal is at a second logic level.

* * * * *